(12) United States Patent
Liu

(10) Patent No.: US 11,415,278 B2
(45) Date of Patent: Aug. 16, 2022

(54) LED LIGHT STRIP BENDABLE IN MULTIPLE DIRECTIONS

(71) Applicants: HUIZHOU CLEAR LIGHTING CO., LTD., Guangdong (CN); SHENZHEN CLEAR LIGHTING CO., LTD., Guangdong (CN)

(72) Inventor: Changgui Liu, Shenzhen (CN)

(73) Assignees: HUIZHOU CLEAR LIGHTING CO., LTD., Guangdong (CN); SHENZHEN CLEAR LIGHTING CO., LTD., Guangdong (CN)

( * ) Notice: Subject to any disclaimer, the term of this patent is extended or adjusted under 35 U.S.C. 154(b) by 0 days.

(21) Appl. No.: 17/541,201

(22) Filed: Dec. 2, 2021

(65) Prior Publication Data

US 2022/0090746 A1 Mar. 24, 2022

Related U.S. Application Data

(63) Continuation of application No. PCT/CN2020/127786, filed on Nov. 10, 2020.

(30) Foreign Application Priority Data

Nov. 13, 2019 (CN) .......................... 201911105070.2

(51) Int. Cl.
*F21S 4/28* (2016.01)
*F21V 23/00* (2015.01)
(Continued)

(52) U.S. Cl.
CPC .............. *F21S 4/28* (2016.01); *F21V 23/002* (2013.01); *F21V 23/004* (2013.01); *H01L 33/486* (2013.01); *F21Y 2115/10* (2016.08)

(58) Field of Classification Search
CPC ....... F21S 4/28; F21S 4/24; F21S 4/22; F21V 23/002; F21V 23/004; F21V 15/00;
(Continued)

(56) References Cited

U.S. PATENT DOCUMENTS

2013/0249394 A1* 9/2013 Fay ...................... B60Q 1/2696
315/297
2017/0227169 A1* 8/2017 Jiang ....................... F21V 29/70
(Continued)

FOREIGN PATENT DOCUMENTS

| CN | 207527349 U | * | 6/2018 |
| CN | 208185965 U | * | 12/2018 |
| CN | 208706175 U | * | 4/2019 |

OTHER PUBLICATIONS

Machine English Translation of CN207527349U; Liu, C; Jun. 2018.*

*Primary Examiner* — Rajarshi Chakraborty
*Assistant Examiner* — Glenn D Zimmerman
(74) *Attorney, Agent, or Firm* — Leong C. Lei

(57) ABSTRACT

An LED light strip bendable in multiple directions is disclosed. The LED light strip bendable in multiple directions includes a core wire having a core wire groove arranged along the direction of said LED light strip in the middle, and at least two main wires arranged in said core wire on both sides of said core wire groove; a plurality of LED light strings arranged in said core wire groove at intervals, which include at least LED light sources, electronic components and connecting wires, and the first and last connecting wires of each LED light string are connected in parallel between said two main wires; an insulation wrap layer wrapped outside said core wire; wherein, said two main lines have a wavy curve structure. By implementing the present invention, multi-directional bending of the light strip can be (Continued)

realized, thereby expanding the application range of the product and convenience of use.

7 Claims, 7 Drawing Sheets

(51) Int. Cl.
*H01L 33/48* (2010.01)
*F21Y 115/10* (2016.01)

(58) Field of Classification Search
CPC ...... F21V 19/001; F21V 23/00; F21V 23/001; H01L 33/486; H01L 25/0753; H01L 33/62; F21Y 2115/10
See application file for complete search history.

(56) References Cited

U.S. PATENT DOCUMENTS

2017/0328527 A1* 11/2017 Yang ................. H01L 33/56
2019/0234597 A1* 8/2019 Zhu ................. F21V 23/002

* cited by examiner

LED LIGHT STRIP BENDABLE IN MULTIPLE DIRECTIONS

RELATED APPLICATIONS

This application is a continuing application of PCT Patent Application Number PCT/CN2020/127786, entitled LED LIGHT STRIP BENDABLE IN MULTIPLE DIRECTIONS, filed on Nov. 10, 2020, which claims priority to China Patent Application No. 201911105070.2 filed on Nov. 13, 2019, both of which are hereby incorporated in its entireties by reference.

FIELD OF THE INVENTION

Embodiments of the present disclosure relate to display field, and more particularly to an LED light strip bendable in multiple directions.

DISCUSSION OF THE RELATED ART

FIGS. 1 to 4 show an existing flexible light strip. Among them, FIG. 1 shows a core wire 1' made of soft elastic plastic or silica gel. At least two main wires 20' and 21' of the same length as the light strip are preset in the core wire 1'. The two main wires are on the same horizontal line and parallel to the surface of the light strip, and in the middle position, a core wire groove 8' with the same length as the core wire is reserved. FIG. 2 shows a light string 3', which includes light sources 5', electronic components 6' and a connecting wire 7'. The light string 3' will be embedded in the core wire groove 8' shown in FIG. 2, then connect the head and tail of the light string in parallel with the main wires 20' and 21' of the core wire 1'. As shown in FIG. 3, usually a light strip is composed of several light string units. On the basis of FIG. 3, a layer of soft elastic plastic or silica gel 4' is coated to form a complete light strip, as shown in FIG. 4.

However, the existing light strip can only be bent in one direction (as shown in FIG. 5). If it is bent in another direction, one of the main wires 20' will be compressed, and the other wire 21' will be stretched. Although the elastic plastic or silica gel can be stretched or compressed, the light strip cannot generate enough force to shorten and elongate the metal wire, therefore, this arrangement structure of the metal wire prevents the light strip from bending in this direction. As shown in FIGS. 6 and 7, when the light strip is bent according to the bending direction of FIG. 6, in theory, the wire 21' will be elongated (see the dotted line L1), and the wire 20' will be compressed (see the dotted line L2). If L1 or L2 exceeds the wire extension or compression limit, or the bending force in this direction is large enough, there is a risk that the wire will be broken. Therefore, the existing light strips greatly limit their use scenarios.

SUMMARY

The technical problem to be solved by the present invention is to provide an LED light strip bendable in multiple directions, so as to realize the multi-direction bending of the light strip, and expand the application range and convenience of the product.

To solve above-mentioned technical problem of the present invention, an LED light strip bendable in multiple directions is provided. The LED light strip bendable in multiple directions comprises: a core wire having a core wire groove arranged along the direction of said LED light strip in the middle, and at least two main wires arranged in said core wire on both sides of said core wire groove; a plurality of LED light strings arranged in said core wire groove at intervals, which include at least LED light sources, electronic components and connecting wires, and the first and last connecting wires of each LED light string are connected in parallel between said two main wires; an insulation wrap layer wrapped outside said core wire; wherein, said two main lines have a wavy curve structure.

Advantageously, said plurality of LED light strings are arranged on the FPCB board, Advantageously, said FPCB board includes a plurality of device soldering areas arranged at intervals, and a connection area between the adjacent device soldering areas; wherein the device soldering area soldered with an SMD LED light source or/SMD electronic components, and said connecting wire for connecting each SMD LED light source and SMD electronic components is formed on said. connection area.

Advantageously, said connection area is a wavy curve structure, and its bending direction is the same as the wavy curve structure of said two main wires.

Advantageously, said device soldering area is rectangular, and the connection area between adjacent device soldering areas is at least a long strip with a width smaller than the width of said device soldering area.

Advantageously, said core wire and said insulating wrap layer are made of soft plastic material or silica gel material.

Advantageously, said main wire is made of copper, aluminum, steel or alloys of the above materials.

Performing the present invention will bring out the following beneficial effects:
- the two main wires in the chip adopt a wavy curve structure, which can improve the ability of the light strip to resist bending, so that it can be bent in multiple directions;
- at the same time, in the FPC board, parts of the structure are also set as a wavy curve structure, which further improves the bending resistance of the light strip.

BRIEF DESCRIPTION OF THE DRAWINGS

In order to more clearly illustrate the embodiments of the present invention or the technical solutions in the prior art, the drawings used in the embodiments or the description of the prior art will be briefly described below. Obviously, the drawings in the following description are only certain embodiments of the present invention, and other drawings can be obtained from those skilled in the art without any creative work.

DETAILED DESCRIPTION OF THE EMBODIMENTS

Figure 1:
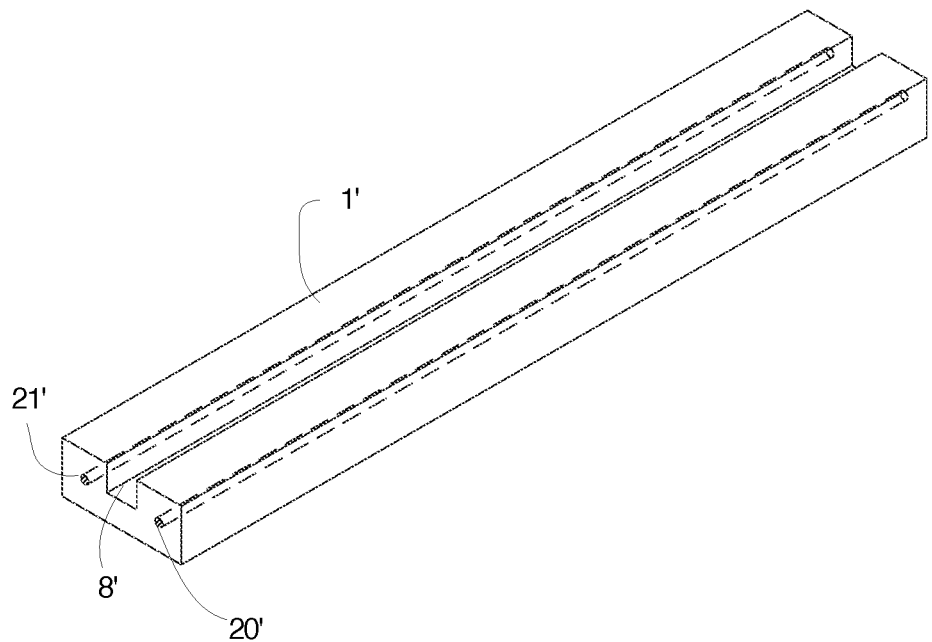
FIG. 1 is a schematic diagram of the core wire structure of an existing flexible light strip.

The technical solutions in the embodiments of the present invention are clearly and completely described below with reference to the accompanying drawings in the embodiments of the present invention. Apparently, the described embodiments are merely some but not all embodiments of the present invention. All other embodiments obtained by a person of ordinary skilled in the art based on the embodiments of the present invention without creative efforts shall fall within the protection scope of the present invention.

Here, it should also be noted that in order to avoid obscuring the present invention with unnecessary detail, only the structures and/or processing steps that are closely related to the solution according to the present invention are shown in the drawings. Other details of the invention which are of little relevance are omitted here.

Figure 2:
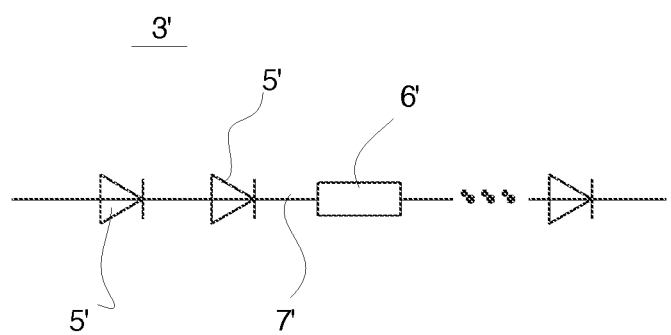
FIG. 2 is a schematic diagram showing the structure of the light string of an existing flexible light strip.
Figure 3:
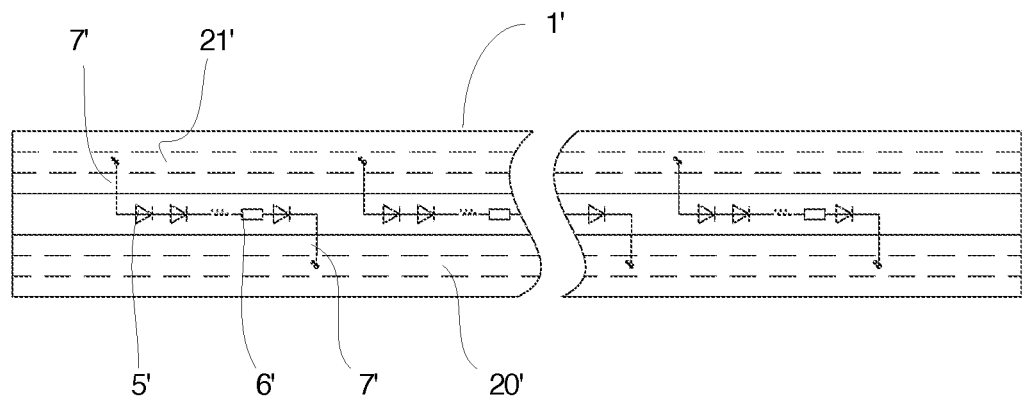
FIG. 3 is a schematic diagram showing the principle of the structure shown in FIG. 1 and FIG. 2 after being assembled.
Figure 8:
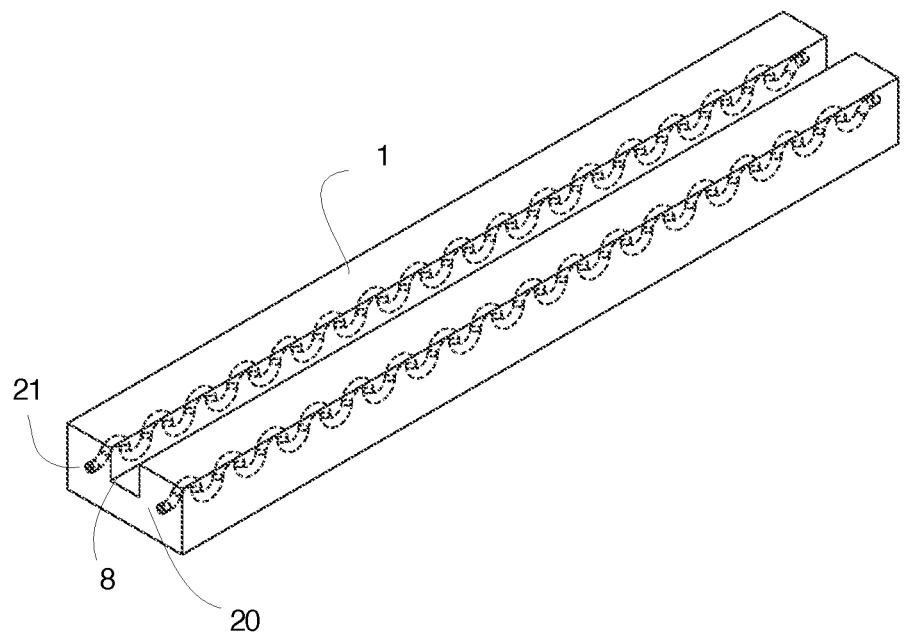
FIG. 8 is a schematic diagram of the core wire structure in an embodiment of the LED light strip bendable in multiple directions provided by the present invention.

As shown in FIG. 8, there is shown a first embodiment of an LED light strip bendable in multiple directions provided by the present invention, and at the same time, please refer to FIGS. 9 to 12 together. In this embodiment, the LED light strip bendable in multiple directions includes:

core wire 1, in this embodiment, its cross-section is roughly concave, but it could be understood that it is not limited to this shape in other embodiments. There is a core wire groove 8 arranged along the direction of the light strip in the middle, and the core wires on both sides of the core groove 8 are provided with at least two main wires. In this embodiment, two main wires 20 and 21 are shown, and it could be understood that more than two main wires may be used in other embodiments;

a plurality of LED light strings 3 are arranged in the core wire groove 8 at intervals, and they include at least LED light sources 5, electronic components 6 and connecting wires. Connecting wires which connect the head and tail of the light string parallel between the main wires 20 and 21. In this embodiment, the structure of the LED light string 3 can be referred to as shown in FIG. 2, and the connection between it and the main wires can be referred to as shown in FIG. 3;

an insulating wrap layer 4 wrapped outside the core wire 1.

Figure 4:
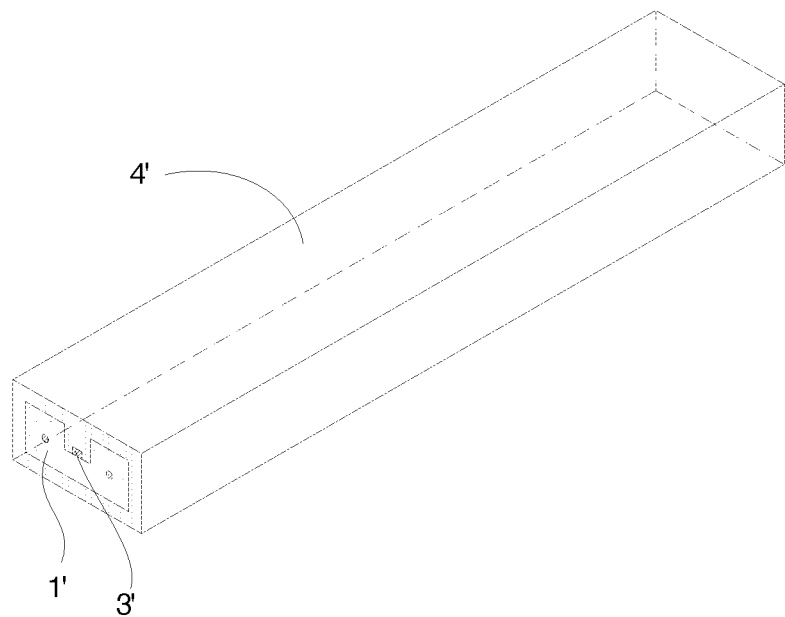
FIG. 4 is a schematic diagram of the structure after being coated with a layer of soft elastic plastic or silica gel on the basis of FIG. 3.
Figure 5:
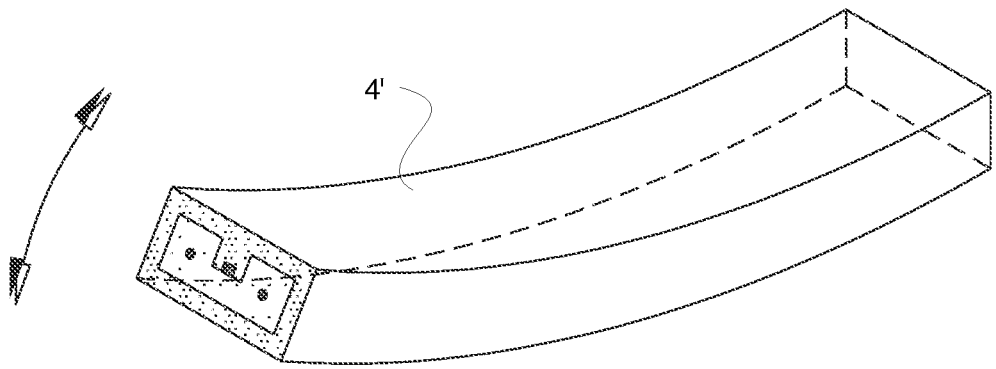
FIG. 5 is a schematic diagram of the structure shown in FIG. 4 bent in one direction.
Figure 6:
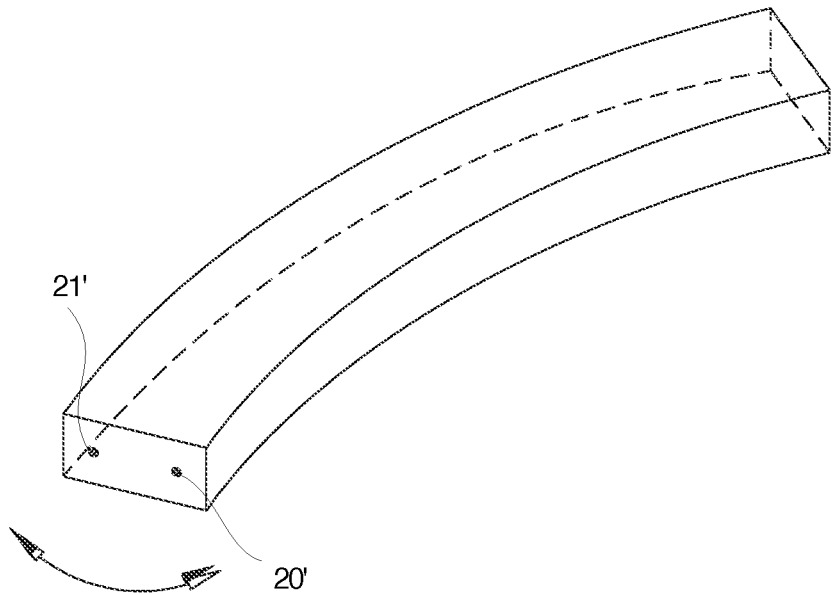
FIG. 6 is a schematic diagram of the structure shown in FIG. 4 bent in another direction.
Figure 7:
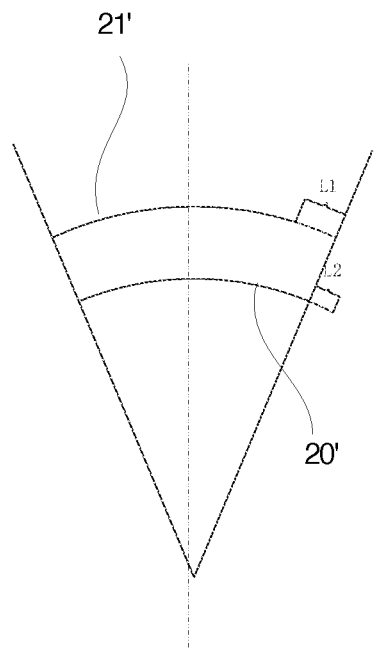
FIG. 7 is a schematic diagram showing the principle of force on the two main wires in FIG. 6.

The main difference between this embodiment and the prior art shown in FIG. 4 is that the two main wires 20 and 21 have a wavy curve structure, specifically, refer to FIG. 8. For the convenience of observation, only one wavy curve structure is shown in the subsequent FIGS. 9 to 11. It is could be understood that this is only for illustration, in actual products, the other main wire also adopts the wavy curve structure.

In this embodiment, the core wire 1 and the insulating wrapping layer 4 can be made of soft plastic materials or silica gel materials. The main wires 20 and 21 can be made of copper, aluminum, steel or alloys of the foregoing materials.

Figure 10:
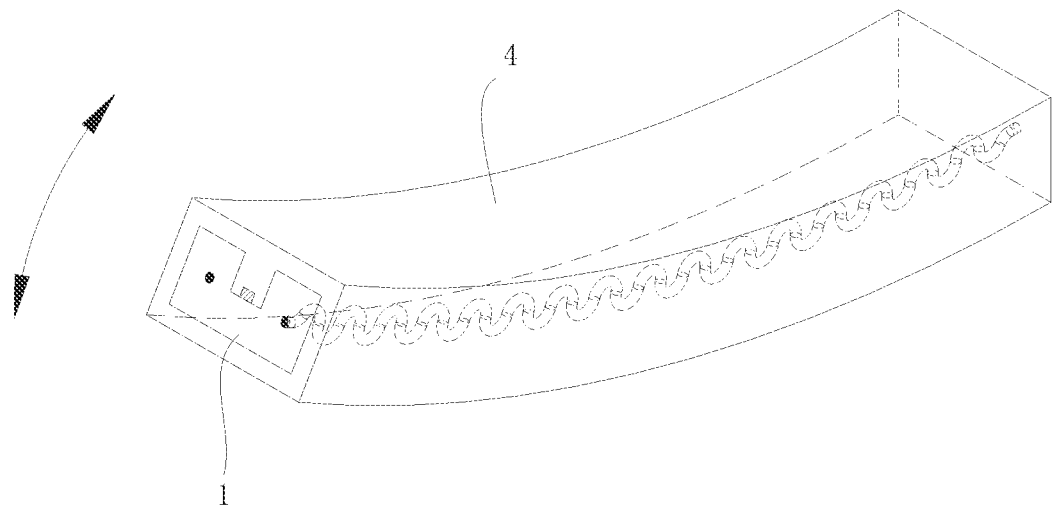
FIG. 10 is a schematic diagram of the structure shown in FIG. 9 bent in one direction.
Figure 11:
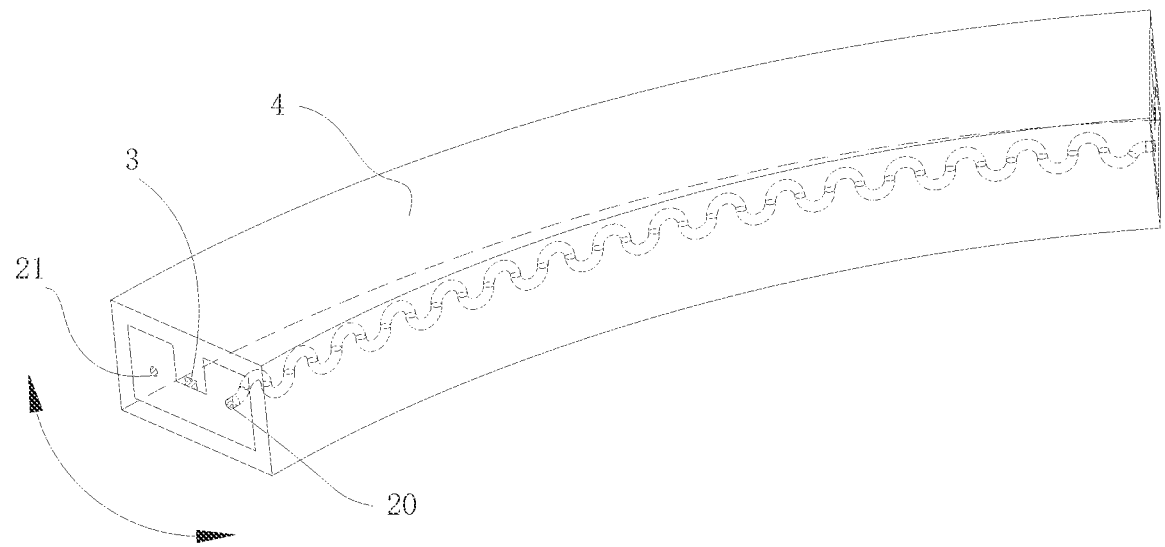
FIG. 11 is a schematic diagram of the structure shown in FIG. 9 bent in another direction.
Figure 12:
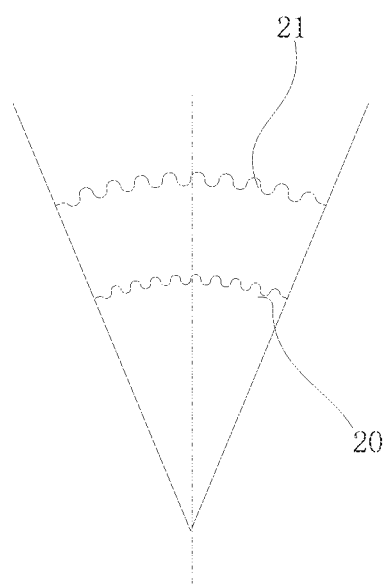
FIG. 12 is a schematic diagram showing the principle of force on the two main wires in FIG. 11.

Referring to FIGS. 10 to 12 together, it can be seen that the light strip of this structure can be bent in multiple directions, such as bending according to the bending directions of FIGS. 10 and 11, and the stretching diagram of the two main wires is shown in FIG. 12. Due to the wavy curve wire structure, it is satisfied that when the light strip is bent in any direction, as the elastic plastic or silica gel stretches and compresses, the main wires 20 and 21 are elongated and shortened like springs, without preventing the bending and deformation of the light strip.

Figure 9:
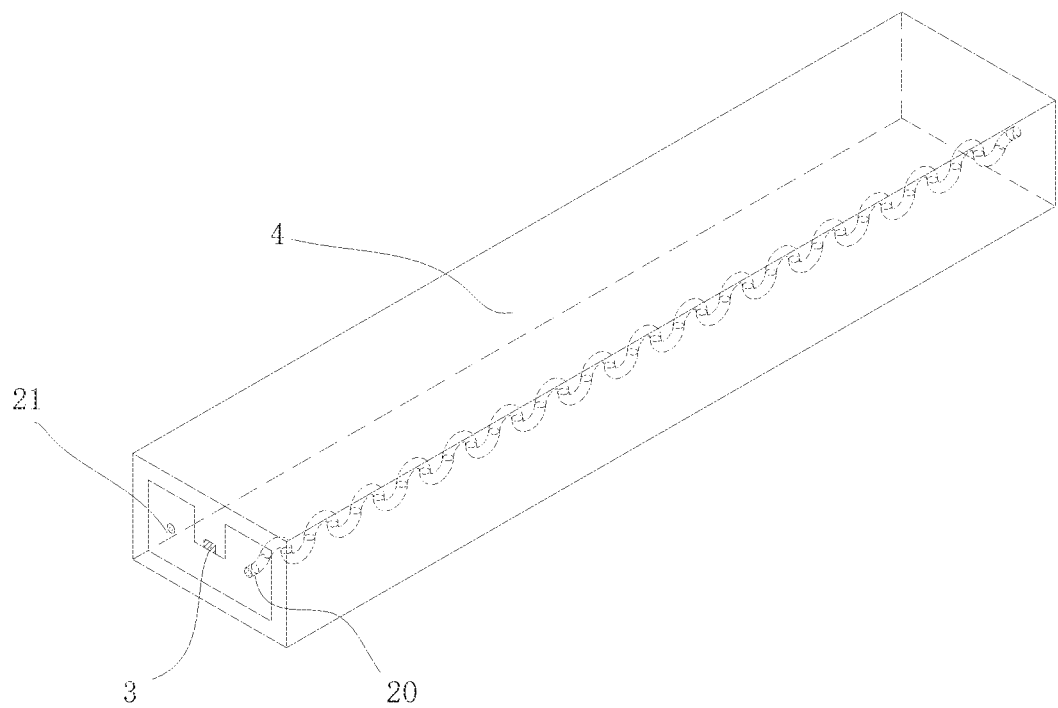
FIG. 9 is a schematic structural diagram of an embodiment of the LED light strip bendable in multiple directions provided by the present invention, in which the core wire of FIG. 8 and the light string of FIG. 2 are assembled.
Figure 13:
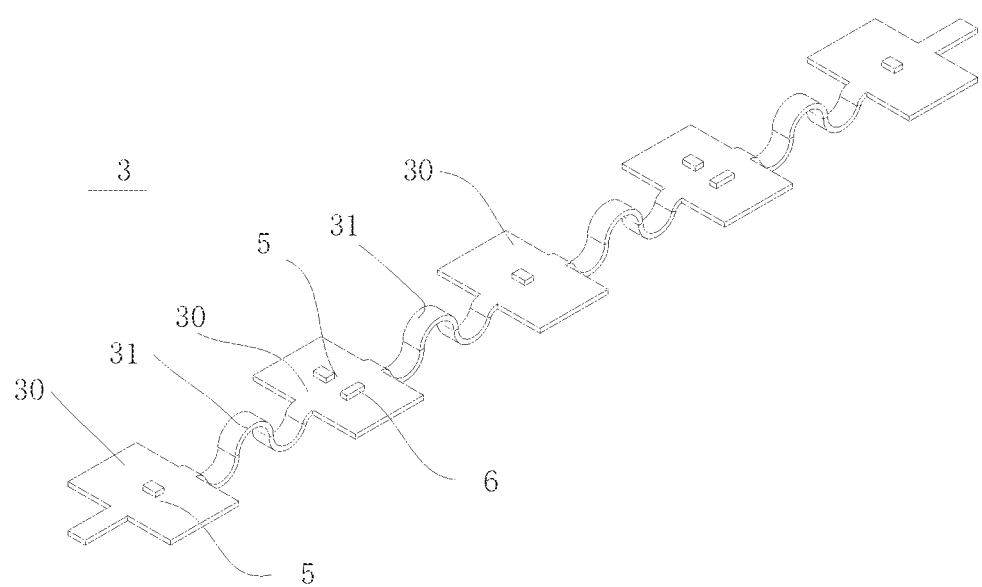
FIG. 13 is a schematic diagram of the structure of the light string in another embodiment of the LED light bendable in multiple directions provided by the present invention.

As shown in FIG. 13, there is shown a structural schematic diagram of a light string in another embodiment of the LED light strip bendable in multiple directions provided by the present invention. In this embodiment, the difference from the structure shown in FIG. 9 is that the plurality of light strings are arranged on the FPCB board. Specifically, the FPCB board includes a plurality of device soldering areas 30 arranged at intervals, and a connection area 31 between adjacent device soldering areas 30, wherein, each device soldering area 30 is soldered with an SMD LED light source 5 or/SMD electronic components 6, a connecting wire connecting each SMD LED light source 5 and SMD electronic components 6 is formed on the connection area 31. In one example, the device soldering area 30 is rectangular, and the connection area 31 between adjacent device soldering areas 30 is at least a long strip (for example, two or more in other examples), and its width is smaller than the width of the described device soldering area 30. It is could be understood that in this embodiment the structure of the connecting wire is the same as that of the connecting wire 7' shown in FIG. 2, so both its structure and label can be referred to as shown in FIG. 2.

In a specific example, the connection area 31 has a wavy curve structure, and its bending direction is the same as the wavy curve structure of the two main wires 20 and 21.

In this embodiment, the light string formed in the FPCB board will also be connected in parallel with the curved main wire. Other structure is the same as the structure shown in the aforementioned FIG. 9 and will not be described in detail here.

FPCB makes it easier to make light strings and can design complex circuits. In addition, by setting a part of the FPCB as a wavy curve structure, the bending resistance of the light strip is further improved.

Performing the present invention will bring out the following beneficial effects:

the two main wires in the chip adopt a wavy curve structure, which can improve the ability of the light strip to resist bending, so that it can be bent in multiple directions;

at the same time, in the FPC board, parts of the structure are also set as a wavy curve structure, which further improves the bending resistance of the light strip.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED light strip bendable in multiple directions, which comprises:

a core wire having a top surface that is recessed in a height-wise direction to define a core wire groove arranged along a longitudinal direction of said LED light strip in the middle, and at least two main wires arranged in said core wire on two opposite sides of said core wire groove in a lateral direction;

a plurality of LED light strings arranged in said core wire groove at intervals, which include at least LED light sources, electronic components and connecting wires, and the first and last connecting wires of each LED light string are connected in parallel between said two main wires;

an insulation wrap layer wrapped outside said core wire;

wherein said two main wires have a wavy curve structure, wherein the wavy curve structure includes multiple waves consecutively connected in the longitudinal direction, and the multiple waves comprise troughs and ridges that are alternate in the longitudinal direction and spaced from each other in the height-wise direction so as to define a bending direction of the wavy structure in the height-wise direction, and wherein the wavy curve structure defines a plane that is parallel to the core wire groove, and each of the plurality of LED light strings comprises two terminal points that are respectively connected to the two main wires and at least one connecting line connected with the two terminal points and having a length extending in the longitudinal direction between the two terminal points, wherein the length of the connecting line that extends between the two terminal points connected to the two main wires comprises a wavily curved arrangement between the two terminal points and located on a plane parallel to the planes of the wave curve structures of the two main wires, wherein the plurality of LED light strings are arranged in the core wire groove and are connected in parallel between the two main wires such that the wavily curved arrangements of the plurality of LED light strings are connected in parallel with each other between the two main wires.

2. The LED light strip as claimed in claim 1, wherein said plurality of LED light strings are arranged on a FPCB board.

3. The light strip as claimed in claim 2, wherein said FPCB board includes a plurality of device soldering areas arranged at intervals, and a connection area between the adjacent device soldering areas; wherein the device soldering area soldered with an SMD LED light source and SMD electronic components, and said connecting line is connected to each SMD LED light source and SMD electronic components and is formed on said connection area.

4. The LED light strip as claimed in claim 3, wherein said connection area is a wavy curve structure, which has a bending direction that is the same as the bending direction of the wavy curve structure of said two main wires.

5. The LED light strip as claimed in claim 4, wherein said device soldering area is rectangular, and the connection area between adjacent device soldering areas is at least a long strip with a width smaller than the width of said device soldering area.

6. The LED light strip as claimed in any of claims 1-5, wherein said core wire and said insulating wrap layer are made of soft plastic material or silica gel material.

7. The LED light strip as claimed in claim 6, wherein said main wire is made of copper, aluminum, steel or alloys of the above materials.

* * * * *